United States Patent
Yoshida

(10) Patent No.: US 6,927,603 B2
(45) Date of Patent: Aug. 9, 2005

(54) SEMICONDUCTOR INTEGRATED CIRCUIT HAVING SYSTEM BUS DIVIDED IN STAGES

(75) Inventor: Takeshi Yoshida, Kawasaki (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 41 days.

(21) Appl. No.: 10/632,866

(22) Filed: Aug. 4, 2003

(65) Prior Publication Data

US 2004/0212407 A1  Oct. 28, 2004

(30) Foreign Application Priority Data

Apr. 25, 2003 (JP) ..................................... P2003-122256

(51) Int. Cl.$^7$ ........................... H03K 19/00; H03L 7/00
(52) U.S. Cl. ............................. 326/93; 326/16; 326/46; 327/141; 365/189.05; 714/734
(58) Field of Search .............................. 326/16, 46, 21, 326/62, 93; 327/141; 365/189.02, 189.05; 714/724, 729, 733, 734

(56) References Cited

U.S. PATENT DOCUMENTS 5,869,979 A  *  2/1999  Bocchino ..................... 326/38
6,418,545 B1  *  7/2002  Adusumilli ................. 714/729

FOREIGN PATENT DOCUMENTS

JP       2003-139818        5/2003

* cited by examiner

*Primary Examiner*—Daniel Chang
(74) *Attorney, Agent, or Firm*—Oblon, Spivak, McClelland, Maier & Neustadt, P.C.

(57) ABSTRACT

A semiconductor integrated circuit having a system bus divided into stages and configured to transfer signals, stage elements configured to connect the stages in series and operate in a divided mode transferring signals from a stage on an input side to a stage on an output side in synchronization with a clock signal and in a through mode that always passes signals from the stage on the input side to the stage on the output side, and a plurality of function modules connected to the different stages.

10 Claims, 5 Drawing Sheets

US 6,927,603 B2

SEMICONDUCTOR INTEGRATED CIRCUIT HAVING SYSTEM BUS DIVIDED IN STAGES

CROSS REFERENCE TO RELATED APPLICATIONS

This application is based upon and claims the benefit of priority from the prior Japanese Patent Application No. P2003-122256 filed on Apr. 25, 2003; the entire contents of which are incorporated herein by reference.

BACKGROUND OF THE INVENTION

1. Field of the Invention

The present invention relates to a semiconductor integrated circuit, and particularly, to a design for improving the testability of the semiconductor integrated circuit.

2. Description of Related Art

Known methods of testing the functions of semiconductor integrated circuits include a method employing scanning, a method employing built-in self test (BIST) circuits, and a method directly supplying or reading data from the outside of an objective semiconductor chip. A function test to be conducted on a semiconductor device having a memory must read and write a large amount of data to and from the device. An example of such a function test is a direct function test (DFT) conducted on, for example, a static random access memory (static RAM) such as a cache memory of a microprocessor, which needs no refreshing operation, and a dynamic RAM such as an embedded DRAM which requires refreshing operation.

In order to quickly read and write a large amount of data in the direct function test, a first related art prepares a direct-function-test bus dedicated to the direct function test separately from an internal bus serving as a system bus for normal operation. The first related art has a problem of requiring additional wiring resources and buffers. To cope with the problem, a second related art employs, as a direct-function-test bus, an internal bus serving as a system bus for normal operation. Generally, the system bus is divided into stages to transfer data at high speed during normal operation. Data is transferred from one stage to another in synchronization with a clock signal.

In a semiconductor device having such a system bus divided into stages, function modules formed in the semiconductor device are often connected to different stages of the system bus. When conducting a direct function test on the function modules, a tester arranged outside the semiconductor device must consider the differences in the stages to which the function modules are connected. This results in complicating test patterns and deteriorating testing efficiency. In particular, when the function modules are memories of the same function, the tester must test the function modules in different sequences to cope with the differences in the stages. This greatly deteriorates testing efficiency.

SUMMARY OF THE INVENTION

An aspect of the present invention provides a semiconductor integrated circuit having a system bus divided into stages and configured to transfer signals, stage elements configured to connect the stages in series and operate in a divided mode transferring signals from a stage on an input side to a stage on an output side in synchronization with a clock signal and in a through mode always passing signals from a stage on the input side to a stage on the output side, and a plurality of function modules connected to the different stages.

DETAILED DESCRIPTION OF EMBODIMENTS

Figure 1:
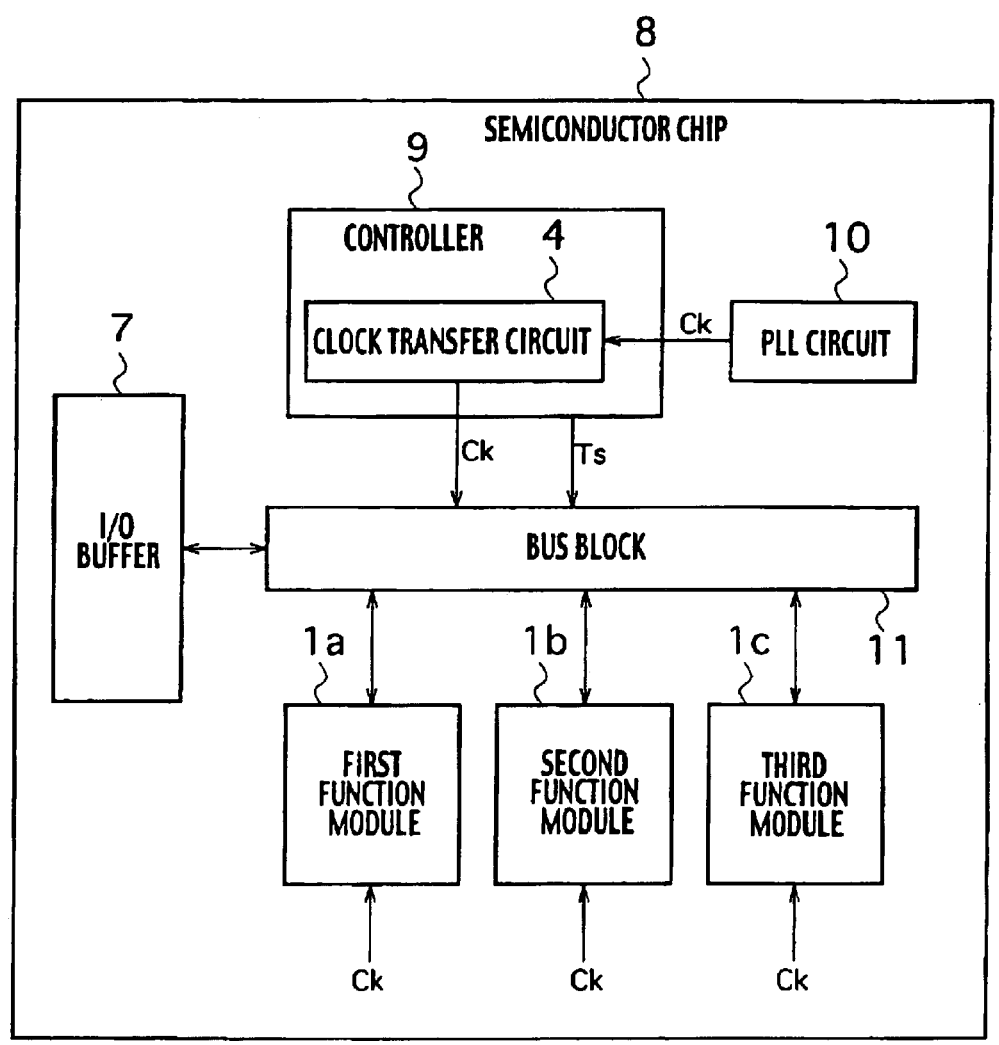
FIG. 1 is a block diagram showing a semiconductor integrated circuit according to an embodiment of the present invention.

Various embodiments of the present invention will be described with reference to the accompanying drawings. It is to be noted that the same or similar reference numerals are applied to the same or similar parts and elements throughout the drawings, and the description of the same or similar parts and elements will be omitted or simplified.

FIG. 1 shows a semiconductor integrated circuit in a semiconductor chip according to an embodiment of the present invention. The semiconductor chip 8 includes function modules (first to third function modules) $1a$ to $1c$ configured to realize essential functions of the semiconductor integrated circuit, a bus block 11 connected to the first to third function modules $1a$ to $1c$, an I/O buffer 7 connected to the bus block 11, a controller 9 connected to the bus block 11, and a phase-locked-loop circuit (PLL circuit) 10. A clock signal Ck is supplied to the first to third function modules $1a$ to $1c$ and controller 9. The controller 9 has a clock transfer circuit 4 configured to transfer the clock signal Ck to the bus block 11. The I/O buffer 7 and bus block 11 send and receive signals to and from the first to third function modules $1a$ to $1c$ and the outside of the chip 8. The controller 9 supplies a through signal Ts to the bus block 11, the through signal Ts controlling a normal operation and a test operation of the semiconductor integrated circuit.

Figure 2:
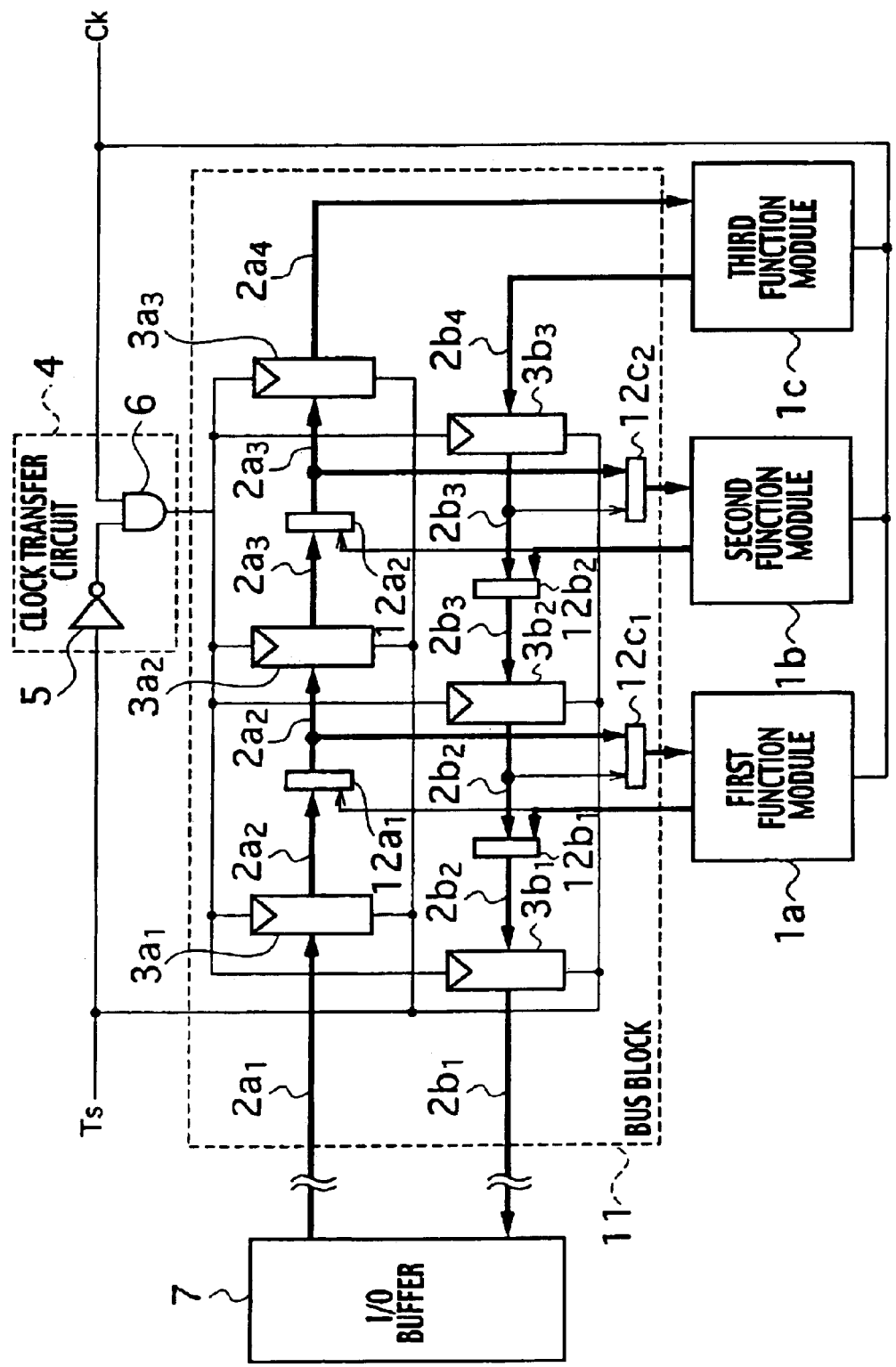
FIG. 2 is a block diagram showing first to third function modules, a bus block, an I/O buffer, and a clock transfer circuit arranged in the semiconductor integrated circuit of FIG. 1.

FIG. 2 is a block diagram showing the first to third function modules $1a$ to $1c$, bus block 11, I/O buffer 7, and clock transfer circuit 4 shown in FIG. 1. The bus block 11 has a system bus 2 ($2a$, $2b$) to transfer signals. The system bus $2a$ is divided into stages $2a1$ to $2a4$. The system bus $2b$ is divided into stages $2b1$ to $2b4$. The bus block 11 further has stage elements $3a1$ to $3a3$ configured to connect the stages $2a1$ to $2a4$ in series, stage elements $3b1$ to $3b3$ configured to connect the stages $2b1$ to $2b4$ in series, and multiplexers (MUXs) $12a1$, $12a2$, $12b1$, $12b2$, $12c1$, and $12c2$. The clock transfer circuit 4 has an inverter 5 to which the through signal Ts is supplied and a logic circuit (AND circuit) 6 to which the output of the inverter 5 and the clock signal Ck are supplied. The system bus 2 has the input system bus $2a$ and output system bus $2b$. The input system bus $2a$ is divided by the stage elements $3a1$ to $3a3$ into the stages $2a1$ to $2a4$. The output system bus $2b$ is divided by the stage elements $3b1$ to $3b3$ into the stages $2b1$ to $2b4$.

The first function module $1a$ is connected to the stage $2a2$ through the MUXs $12a1$ and $12c1$ and to the stage $2b2$ through the MUXs $12b1$ and $12c1$. The second function module 1b is connected to the stage 2a3 through the MUXs 12a2 and 12c2 and to the stage 2b3 through the MUXs 12b2 and 12c2. The third function module 1c is connected to the stages 2a4 and 2b4. Namely, the first to third function modules 1a to 1c are connected to different ones of the stages 2a2 to 2a4 and 2b2 to 2b4. The output of the AND circuit 6 is connected to the stage elements 3a1 to 3a3 and 3b1 to 3b3. The I/O buffer 7 is connected to the stages 2a1 and 2b1. The clock signal Ck is supplied to the first to third function modules 1a to 1c. An output signal from the AND circuit 6 and the through signal Ts are supplied to the stage elements 3a1 to 3a3 and 3b1 to 3b3. The first to third function modules 1a to 1c have equivalent functions and are, for example, memories having a function of storing data.

Figure 3:
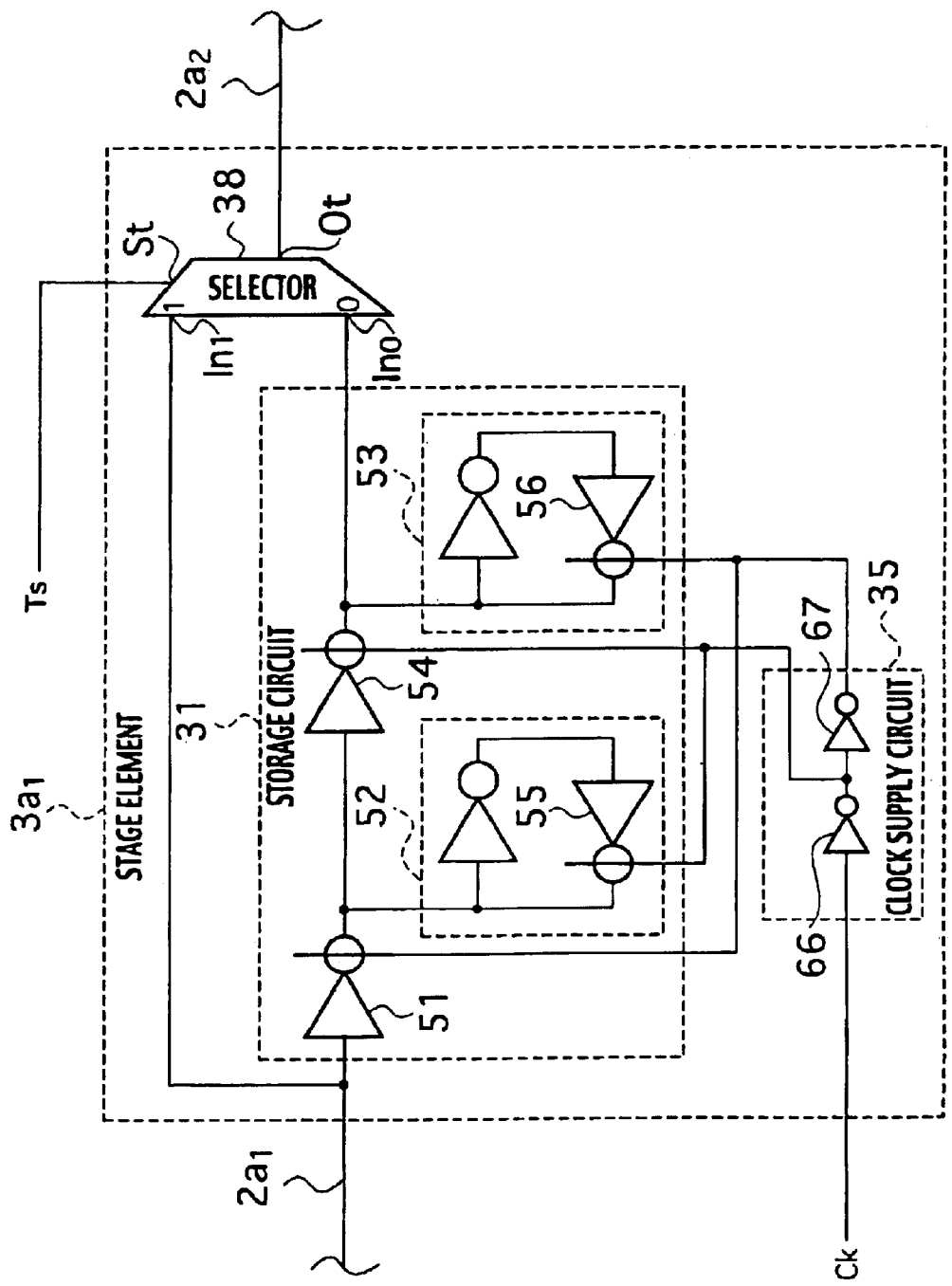
FIG. 3 is a circuit diagram showing an example of a stage element shown in FIG. 2.

FIG. 3 shows an exemplary structure of the stage element 3a1. The stage element 3a1 has a storage circuit 31 connected to the stage 2a1 on the input side, a selector 38 connected to the storage circuit 31 and the stage 2a2 on the output side, and a clock supply circuit 35 configured to supply the clock signal Ck to the storage circuit 31.

The storage circuit 31 is a flip-flop circuit including an inverter 51 connected to the stage 2a1 on the input side, a first latch circuit 52 connected to the output of the inverter 51, an inverter 54 connected to the output of the inverter 51, and a second latch circuit 53 connected to the output of the inverter 54. The selector 38 is connected to the output of the inverter 54.

The selector 38 has a first input terminal In1 directly connected to the stage 2a1 on the input side, a second input terminal In0 connected through the storage circuit 31 to the stage 2a1, an output terminal Ot connected to the stage 2a2 on the output side, and a switching terminal St for receiving the through signal Ts that switches connections between the first and second input terminals In1 and In0 and the output terminal Ot from one to another. The second input terminal In0 is connected to the output of the inverter 54.

The clock supply circuit 35 has an inverter 66 to which the clock signal Ck is supplied and an inverter 67 connected to the output of the inverter 66. In the clock supply circuit 35, the inverter 66 generates a clock signal whose phase is opposite to that of the clock signal Ck, and the inverter 67 generates a clock signal whose phase is the same as that of the clock signal Ck. The in-phase and opposite-phase clock signals generated by the clock supply circuit 35 are supplied to the storage circuit 31. More precisely, the opposite-phase clock signal is supplied to the inverters 54 and 55, and the in-phase clock signal is supplied to the inverters 51 and 56.

The other stage elements 3a2, 3a3, and 3b1 to 3b3 each have a similar structure to that of the stage element 3a1 of FIG. 3.

Operation of the semiconductor integrated circuit shown in FIGS. 1 to 3 will be explained.

When the controller 9 of FIG. 1 sets the through signal Ts to a logic value of 0 (disable), the clock transfer circuit 4 of FIG. 2 transfers the clock signal Ck to the stage elements 3a1 to 3a3 and 3b1 to 3b3. With the through signal Ts of logic value 0, the selector 38 of FIG. 3 connects the second input terminal In0 to the output terminal Ot, thereby connecting the stage 2a1 on the input side to the stage 2a2 on the output side through the storage circuit 31. This sets the stage element 3a1 to a "divided mode." Similarly, the other stage elements 3a2, 3a3, and 3b1 to 3b3 are set to the divided mode.

When the clock signal Ck has a logic value of 1 in the divided mode, the inverter 51 of FIG. 3 opens, and the inverters 54 and 55 close. As a result, the inverter 51 provides an inverted value of a signal from the stage 2a1 on the input side to the first latch circuit 52 and inverter 54. When the clock signal Ck has a logic value of 0 in the divided mode, the inverters 51 and 56 close, and the inverters 54 and 55 are opened. As a result, the first latch circuit 52 holds an inverted value of a signal from the stage 2a1, and the inverter 54 further inverts the inverted value of the signal from the stage 2a1 and provides the logic value of the signal from the stage 2a1 to the second latch circuit 53 and selector 38. Consequently, the selector 38 transfers the signal from the inverter 54 to the stage 2a2 on the output side.

In this way, the storage circuit 31 latches and stores, in synchronization with the clock signal Ck, the logic value and inverted value of a signal transferred from the stage 2a1 on the input side. Namely, in the divided mode, the stage element 3a1 transfers a signal from the stage 2a1 on the input side to the stage 2a2 on the output side in synchronization with the clock signal Ck. Similarly, the other stage elements 3a2, 3a3, and 3b1 to 3b3 of FIG. 2 transfer signals from the stages 2a2, 2a3, and 2b2 to 2b4 on the input side to the stages 2a3, 2a4, and 2b1 to 2b3 on the output side in synchronization with the clock signal Ck. This means that, when the through signal Ts is set to the logic value of 0 to establish the divided mode, the stage elements 3a1 to 3a3 and 3b1 to 3b3 function as flip-flop circuits to divide the system bus 2. As a result, the semiconductor integrated circuit can perform a normal operation with the system bus 2 operating at high speed. When the system bus 2 extends for a long distance in the semiconductor chip 8 of FIG. 1, dividing the system bus 2 with the stage elements 3a1 to 3a3 and 3b1 to 3b3 into the stages secures an operation frequency required for the semiconductor integrated circuit.

When the controller 9 of FIG. 1 sets the through signal Ts to a logic value of 1 (enable), the clock transfer circuit 4 of FIG. 2 transfers no clock signal Ck to the stage elements 3a1 to 3a3 and 3b1 to 3b3, and instead, continuously supplies a signal of logic value of 0 thereto. Setting the through signal Ts to the logic value 1 connects the first input terminal In1 of the selector 38 of FIG. 3 to the output terminal Ot thereof. As a result, the stage 2a1 on the input side is directly connected to the stage 2a2 on the output side without interposing the storage circuit 31 therebetween. Namely, the stage element 3a1 is set in a "through mode." Similarly, the other stage elements 3a2, 3a3, and 3b1 to 3b3 of FIG. 2 are set in the through mode. In the through mode, the stage elements 3a1 to 3a3 and 3b1 to 3b3 do not function as the flip-flop circuits that divide the system bus 2. Signals transferred from the stages 2a1 to 2a3 and 2b2 to 2b4 on the input side are transferred as they are to the stages 2a2 to 2a4 and 2b1 to 2b3 on the output side. In other words, in the through mode, the stage elements 3a1 to 3a3 and 3b1 to 3b3 always pass signals from the stages 2a1 to 2a3 and 2b2 to 2b4 on the input side to the stages 2a2 to 2a4 and 2b1 to 2b3 on the output side.

Next, data transfer to the first to third function modules 1a to 1c through the bus block 11 of FIG. 1 will be explained.

In the divided mode, the semiconductor integrated circuit operates in the normal mode. In the normal mode, supplying the clock signal Ck for two cycles to the stage element 3a1 of FIG. 2 transfers data from the I/O buffer 7 to the first functional module 1a. Namely, transferring data from the I/O buffer 7 to the first function module 1a requires two clock cycles. Also, transferring data from the first function module 1a to the I/O buffer 7 requires two clock cycles. Transferring data from the I/O buffer 7 to the second function module 1b and transferring data from the second function module 1b to the I/O buffer 7 additionally involve the stage elements 3a2 and 3b2, and therefore, require three clock cycles, respectively. Similarly, transferring data from the I/O buffer 7 to the third function module 1c and transferring data from the third function module 1c to the I/O buffer 7 additionally involve the stage elements 3a3 and 3b3, and therefore, require four clock cycles, respectively.

To conduct a direct function test on the semiconductor integrated circuit of FIG. 1, an external tester is connected to the circuit through the I/O buffer 7. Testing the first to third function modules 1a to 1c in the divided mode will be examined. Accessing the first function module 1a requires an overhead of four to-and-fro clock cycles in total, accessing the second function module 1b requires an overhead of six to-and-fro clock cycles in total, and accessing the third function module 1c requires an overhead of eight to-and-fro clock cycles in total. Since the stages 2a2 to 2a4 and 2b2 to 2b4 connected to the first to third function modules 1a to 1c are different from one another, overheads to access the first to third function modules 1a to 1c differ from one another. Even if the first to third function modules 1a to 1c have the same function and even if the contents of tests conducted on the function modules are the same, separate test patterns must be prepared for the first to third function modules 1a to 1c in consideration of the overheads, if the tests are to be conducted in the divided mode.

In view of this, when conducting a direct function test on the semiconductor integrated circuit with the use of an external tester, the through signal Ts is set to a logic value of 1 (enable) to operate the stage elements 3a1 to 3a3 and 3b1 to 3b3 in the through mode in which signals from the stages 2a1 to 2a3 and 2b2 to 2b4 on the input side are continuously passed as they are to the stages 2a2 to 2a4 and 2b1 to 2b3 on the output side. In the through mode, the stage elements 3a1 to 3a3 and 3b1 to 3b3 directly connect the stages 2a1 to 2a3 and 2b2 to 2b4 on the input side to the stages 2a2 to 2a4 and 2b1 to 2b3 on the output side, so that the input system bus 2a and output system bus 2b may each form a single internal bus not divided into stages. To transfer data from the I/O buffer 7 to the first to third function modules 1a to 1c in the through mode, one system clock is needed. Similarly, to transfer data from the first to third function modules 1a to 1c to the I/O buffer 7, one system clock is needed. Namely, data can be transferred in one clock cycle from the I/O buffer 7 to all of the function modules 1a to 1c that are connected to different ones of the stages 2a1 to 2a4 and 2b1 to 2a4. Also, data can be transferred in one clock cycle from all of the function modules 1a to 1c to the I/O buffer 7. Even if the first to third function modules 1a to 1c are connected to different stages form among stages 2a1 to 2a4 and 2b1 to 2a4, the first to third function modules 1a to 1c have the same overhead to access them. Therefore, test patterns for the first to third function modules 1a to 1c can be prepared without considering overhead timing. In particular, when tests to be conducted on the first to third function modules 1a to 1c having the same function are of the same contents, the same test pattern will be applicable to the first to third function modules 1a to 1c. In this case, the external tester can equally handle the first to third function modules 1a to 1c and easily perform the tests. Namely, the external tester can conduct a direct function test on the first to third function modules 1a to 1c with the same test pattern.

As mentioned above, the divided mode needs four system clock cycles to access the third function module 1c. On the other hand, the through mode needs only one system clock cycle to access the third function module 1c. Namely, the operation frequency of the through mode is ¼ or smaller relative to that of the divided mode. When conducting tests at normal-operation frequency, the through mode is not used. Instead, the through signal Ts is set to a logic value of 0 (disable) to establish the divided mode, and the tests are conducted using the stage dividing function of the stage elements 3a1 to 3a3 and 3b1 to 3b3.

In the through mode, the stage elements 3a1 to 3a3 and 3b1 to 3b3 stop to function as flip-flop circuits, and therefore, there is no need to supply the clock signal Ck to the stage elements 3a1 to 3a3 and 3b1 to 3b3. Accordingly, the clock transfer circuit 4 may stop transferring the clock signal Ck to the stage elements 3a1 to 3a3 and 3b1 to 3b3, thus reducing the power consumption of the semiconductor integrated circuit in the through mode. Recent semiconductor chips are highly integrated and operate at high frequencies to increase leak current and current consumption. The current consumption of a semiconductor chip must be reduced not only during a normal operation but also during a mass-production test. This is because an increase in current consumption in a test is a factor limiting the number of chips that can be tested simultaneously. When the current consumption of a chip determines an upper limit of the number of chips that can be tested simultaneously, the supply of a clock signal to the stage elements 3a1 to 3a3 and 3b1 to 3b3 in the through mode must be stopped, in order to reduce current consumption in tests and relax the upper limit of the number of chips to be tested simultaneously.

(First Modification)

Figure 4A:
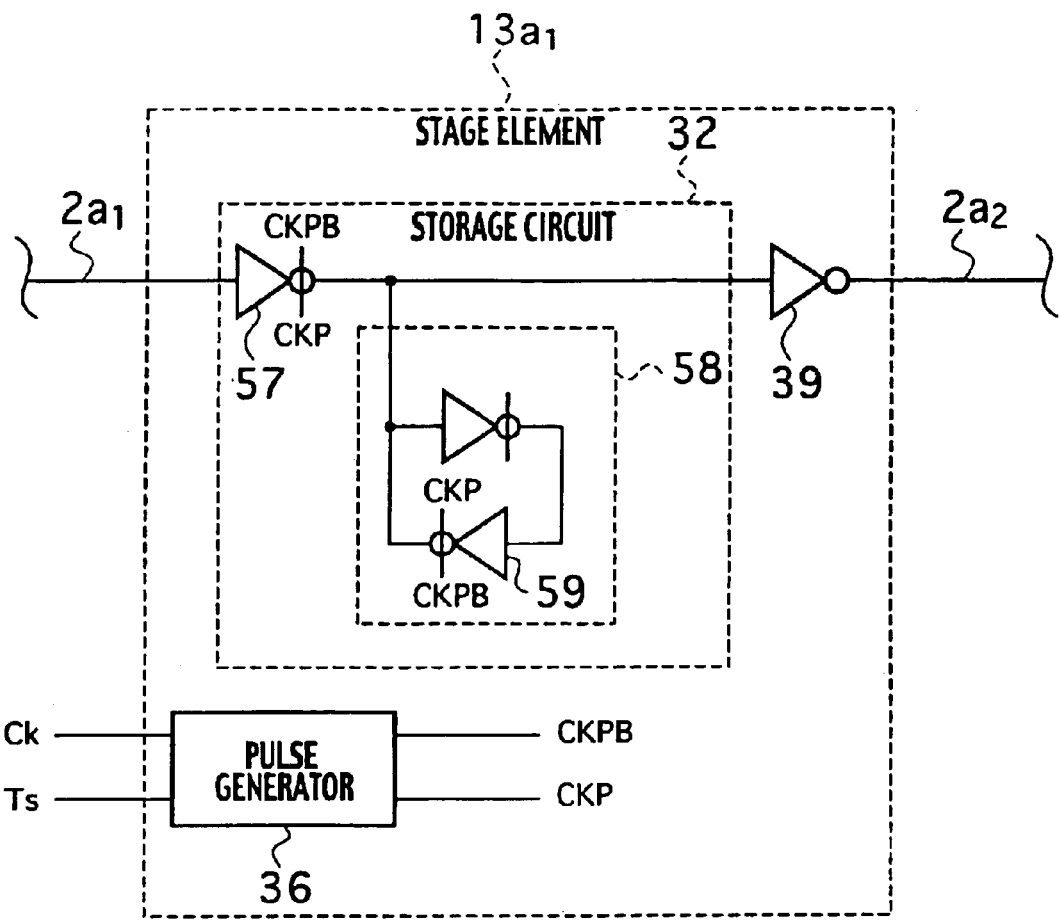
FIG. 4A is a circuit diagram showing a stage element according to a first modification of the embodiment of the present invention.

FIG. 4A is a circuit diagram showing a stage element according to a first modification of the embodiment shown in FIG. 3.

In FIG. 4A, the stage element 13a1 according to the first modification has a storage circuit 32 connected to the stage 2a1 on the input side, an inverter 39 connected to the storage circuit 32 and the stage 2a2 on the output side, and a pulse generator 36 connected to the storage circuit 32. The storage circuit 32 is a flip-flop circuit having an inverter 57 connected to the stage 2a1 and a latch circuit 58 connected to the output of the inverter 57. The output of the inverter 5.7 is also connected to the input of the inverter 39.

Figure 4B:
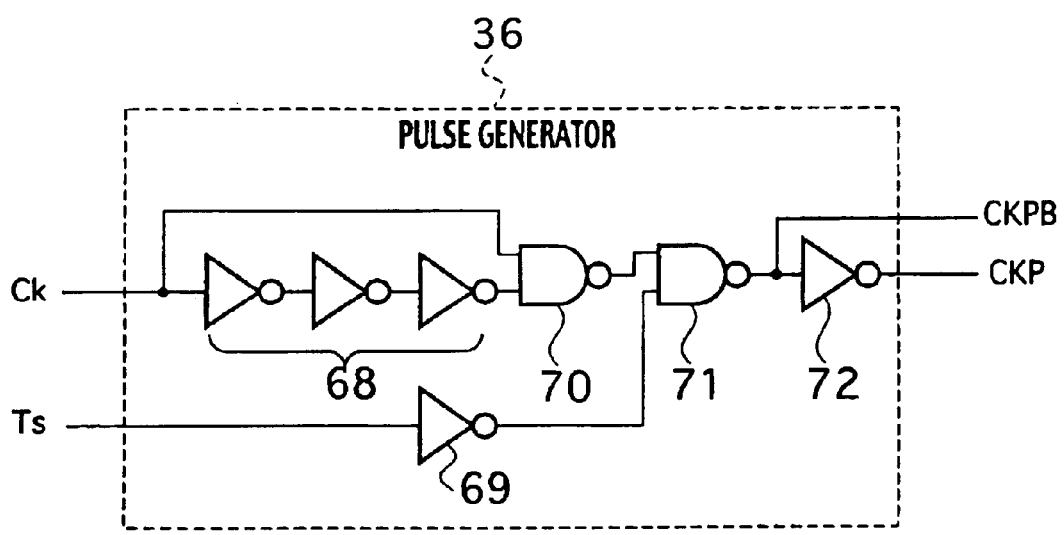
FIG. 4B is a circuit diagram showing a pulse generator shown in FIG. 4A.

FIG. 4B is a circuit diagram showing the pulse generator 36. The pulse generator 36 has an inverting delay circuit 68 having an odd number of inverters (for example, three) connected in series, a NAND circuit 70 having a first input terminal to which the clock signal Ck is supplied through the delay circuit 68 and a second input terminal to which the clock signal Ck is directly supplied, an inverter 69 to which the through signal Ts is supplied, a NAND circuit 71 connected to the output of the NAND circuit 70 and the output of the inverter 69, and an inverter 72 connected to the output of the NAND circuit 71.

According to the first modification, the other stage elements 3a2, 3a3, and 3b1 to 3b3 of FIG. 2 each have a similar circuit arrangement to that of the stage element 13a1 of FIGS. 4A and 4B.

Next, operation of the stage element 13a1 shown in FIGS. 4A and 4B will be explained.

The inverting delay circuit 68 of FIG. 4B generates a delayed clock signal whose phase is opposite to the clock signal Ck. The NAND circuit 70 receives the inverted and delayed clock signal and the clock signal Ck and generates a pulse signal synchronous to the clock signal Ck. For example, the pulse signal rises at a rise of the clock signal Ck and falls at a pulse width shorter than ½ period of the clock signal Ck.

When the through signal Ts has a logic value of 0 to establish the divided mode, the NAND circuit 71 receives a signal having a logic value of 1 from the inverter 69 and the pulse signal from the NAND circuit 70. The NAND circuit 71 then generates a clock pulse signal CKPB whose phase is opposite to that of the pulse signal generated by the NAND circuit 70. The inverter 72 generates a clock pulse signal CKP whose phase is the same as that of the pulse signal generated by the NAND circuit 70. Consequently, in the divided mode, the pulse generator 36 of FIG. 4A generates the clock pulse signals CKP and CKPB and supplies them to the inverters 57 and 59. When the clock pulse signals CKP and CKPB have logic values of 1 and 0, respectively, the inverter 57 opens and the inverter 59 closes. As a result, the inverter 57 transfers an inverted value of a signal from the stage 2a1 on the input side to the latch circuit 58 and inverter 39. The inverter 39 further inverts the inverted value and transfers the logic value from the stage 2a1 to the stage 2a2 on the output side. When the clock signals CKP and CKPB have logic values of 0 and 1, respectively, the latch circuit 58 holds an inverted value of a signal from the stage 2a1.

In this way, in the divided mode, the storage circuit 32 functions as a pulse flip-flop circuit that latches and holds an inverted value of a signal transferred from the stage 2a1 on the input side in synchronization with the clock pulse signals CKP and CKPB. Namely, the pulse flip-flop circuit latches a signal only during a period in which the clock pulse signal CKP is rising and holds the signal when the clock pulse signal CKP falls. In this way, the stage element 13a1 transfers a signal from the stage 2a1 on the input side to the stage 2a2 on the output side in synchronization with the clock signal Ck. Similarly, according to first modification, the other stage elements 3a2, 3a3, and 3b1 to 3b3 of FIG. 2 transfer signals from the stages 2a2, 2a3, and 2b2 to 2b4 on the input side to the stages 2a3, 2a4, and 2b1 to 2b3 on the output side in synchronization with the clock signal Ck, respectively.

When the through signal Ts have a logic value of 1 to establish the through mode, the NAND circuit 71 receives a signal having a logic value of 0 from the inverter 69 and a clock pulse signal from the NAND circuit 66 and continuously generates a signal having a logic value of 0. As a result, the pulse generator 36 continuously generates a signal having a logic value of 1 instead of the clock pulse signal CKP and a signal of logic value of 0 instead of the clock pulse signal CKPB. Therefore, the inverter 57 maintains an open state and the inverter 59 maintains a closed state, and the storage circuit 32 always passes a signal as it is from the stage 2a1 on the input side to the stage 2a2 on the output side.

In this way, when the pulse generator 36 receives a logic to continuously raise the clock pulse signal CKP, the through mode to continuously pass through the storage circuit 32 is established. Employing the pulse generator 36 eliminates the selector 38 of FIG. 3. The selector 38 is added only for function tests, and therefore, is a factor to delay the data transmission speed of the system bus 2 in a normal operation. On the other hand, adding the logic gate (NAND circuit) 71 to the pulse generator 36 in the stage element 13a1 of FIGS. 4A and 4B never increases delay in the data transmission speed. The pulse generator 36 may be shared by a plurality of storage circuits 32, to minimize an area increase in the device due to the addition of the testing logic.

(Second Modification)

Figure 5:
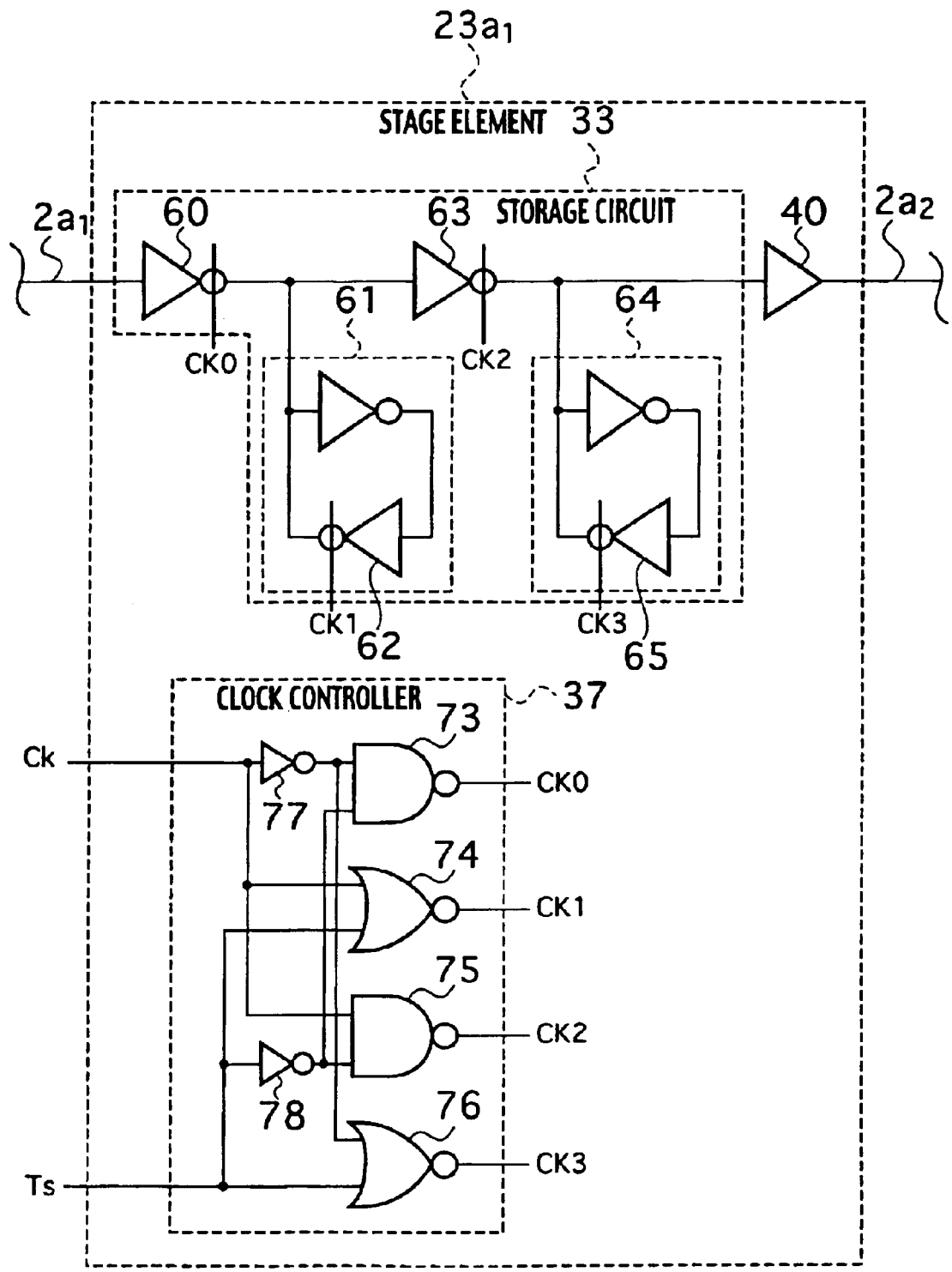
FIG. 5 is a circuit diagram showing a stage element according to a second modification of the embodiment of the present invention.

FIG. 5 is a circuit diagram showing a stage element according to a second modification of the embodiment shown in FIG. 3.

In FIG. 5, the stage element 23a1 according to the second modification has a storage circuit 33 connected to the stage 2a1 on the input side, a buffer 40 connected to the storage circuit 33 and the stage 2a2 on the output side, and a clock controller 37 connected to the storage circuit 33.

The storage circuit 33 is a flip-flop circuit having an inverter 60 connected to the stage 2a1 on the input side, a first latch circuit 61 connected to the output of the inverter 60, an inverter 63 connected to the output of the inverter 60, and a second latch circuit 64 connected to the output of the inverter 63. The buffer 40 is connected to the output of the inverter 63.

The clock controller 37 has an inverter 77 to which the clock signal Ck is supplied, an inverter 78 to which the through signal Ts is supplied, a NOR circuit 74 to which the clock signal Ck is supplied, a NAND circuit 75 to which the clock signal Ck is supplied, a NAND circuit 73 connected to the output of the inverter 77, and a NOR circuit 76 connected to the output of the inverter 77. The NAND circuit 73 supplies a clock signal CK0 to the inverter 60. The NOR circuit 74 supplies a clock signal CK1 to the inverter 62. The NAND circuit 75 supplies a clock signal CK2 to the inverter 63. The NOR circuit 76 supplies a clock signal CK3 to the inverter 65.

According to second modification, the other stage elements 3a2, 3a3, and 3b1 to 3b3 shown in FIG. 2 have each a similar circuit configuration to that of the stage element 23a1 of FIG. 5.

Next, operation of the stage element 23a1 of FIG. 5 will be explained.

When the controller 9 of FIG. 1 sets the through signal Ts to a logic value 0 to establish the divided mode, a signal having a logic value of 0 is supplied to Ts input terminals of the NOR circuits 74 and 76 and a signal having a logic value of 1 is supplied to Ts input terminals of the NAND circuits 73 and 75. When the clock signal Ck has a logic value of 1, clock input terminals of the NOR circuit 74 and NAND circuit 75 receive a signal having a logic value of 1, and clock input terminals of the NAND circuit 73 and NOR circuit 76 receive a signal having a logic value of 0. As a result, the clock signal CK0 has a logic value of 1, the clock signal CK1 a logic value of 0, the clock signal CK2 a logic value of 0, and the clock signal CK3 a logic value of 1. On the other hand, when the clock signal Ck has a logic value of 0, the clock input terminals of the NOR circuit 74 and NAND circuit 75 receive a signal having a logic value of 0, and the clock input terminals of the NAND circuit 73 and NOR circuit 76 receive a signal having a logic value of 1. As a result, the clock signal CK0 has a logic value of 0, the clock signal CK1 a logic value of 1, the clock signal CK2 a logic value of 1, and the clock signal CK3 a logic value of 0. Namely, the clock signals CK0 and CK3 each have the same phase as the clock signal Ck, and the clock signals CK1 and CK2 each have an opposite phase to the clock signal Ck. When the clock signal Ck has a logic value of 1, the inverter 60 opens and the inverters 62 and 63 close. When the clock signal Ck has a logic value of 0, the inverters 60 and 65 close and the inverters 62 and 63, open. The stage element 23a1, therefore, transfers a signal from the stage 2a1 on the input side to the stage 2a2 on the output side in synchronization with the clock signal Ck. Namely, the storage circuit 33 functions as a flip-flop circuit with the stage element 23a1 being in the divided mode.

On the other hand, when the controller 9 of FIG. 1 sets the through signal Ts to a logic value of 1 to establish the through mode, a signal having a logic value of 1 is supplied to the Ts input terminals of the NOR circuits 74 and 76 of FIG. 5 and a signal having a logic value of 0 is supplied to the Ts input terminals of the NAND circuits 73 and 75. At this time, when the clock signal Ck has a logic value of 1, the clock signal CK0 has a logic value of 1, the clock signal CK1 a logic value of 0, the clock signal CK2 a logic value of 1, and the clock signal CK3 a logic value of 0. When the clock signal Ck has a logic value of 0, the clock signal CK0 has a logic value of 1, the clock signal CK1 a logic value of 0, the clock signal CK2 a logic value of 1, and the clock signal CK3 a logic value of 0. Namely, the clock signals CK0 and CK2 each have a logic value 1 irrespective of the value of the clock signal Ck, and the clock signals CK1 and CK3 have a logic value of 0 irrespective of the value of the clock signal Ck. The inverters 60 and 63 remain open, and the inverters 62 and 65 remain closed. Accordingly, the stage element 23a1 passes a signal as it is from the stage 2a1 on the input side to the stage 2a2 on the output side. In this case, the storage circuit 33 does not function as a flip-flop circuit with the stage element 23a1 being in the through mode.

As explained above, the clock controller 37 employs a logic of setting the clock signals CK0 and CK2 to an always risen state, to set the stage element 23a1 in the through mode. Employing the clock controller 37 eliminates the selector 38 of FIG. 3. Adding the clock controller 37 to the stage element 23a1 of FIG. 5 never increases delay in data transmission speed. The single clock controller 37 may be shared by a plurality of storage circuits 33, to minimize an area increase in the device due to the addition of the testing logic.

In this way, the embodiment of the present invention and the first and second modifications of the embodiment provide semiconductor integrated circuits that facilitate the testing thereof.

Although the present invention has been explained in connection with the embodiments, and first and second modifications, it must be understood that the descriptions and accompanying drawings of this specification are not restrictive to the present invention.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A semiconductor integrated circuit comprising:
a system bus divided into stages and configured to transfer signals;
stage elements configured to connect the stages in series and operate in a divided mode transferring signals from a stage on an input side to a stage on an output side in synchronization with a clock signal and in a through mode that always passes signals from the state on the input side to the stage on the output side; and
a plurality of function modules connected to the different stages,
wherein each of the stage elements comprises:
a storage circuit configured to hold a signal transferred from the stage on the input side, comprising a flip-flop circuit configured to latch and hold the signal in synchronization with the clock signal; and
a selector comprising:
a first input terminal connected to the stage on the input side;
a second input terminal connected to the stage on the input side through the flip-flop circuit;
an output terminal connected to the stage on the output side; and
a switching terminal configured to receive a through signal switching connections between the first and second input terminals and the output terminal from one to another, wherein:
the selector connects the second input terminal to the output terminal in the divided mode and connects the first input terminal to the output terminal in the through mode.

2. A semiconductor integrated circuit comprising:
a system bus divided into stages and configured to transfer signals;
stage elements configured to connect the stages in series and operate in a divided mode transferring signals from a stage on an input side to a stage on an output side in synchronization with a clock signal and in a through mode that always passes signals from the stage on the input side to the stage on the output side; and
a plurality of function modules connected to the different stages,
wherein each of the stage elements comprises:
a storage circuit configured to hold a signal transferred from the stage on the input side, comprising a flip-flop circuit configured to latch and hold the signal in synchronization with the clock signal; and
a pulse generator configured to generate pulse signals synchronous to the clock signal in the divided mode, and in the through mode, stop the generation of the pulse signals and keep the storage circuit passing the signal therethrough, and the flip-flop circuit latches and holds the signal in synchronization with the pulse signals.

3. A semiconductor integrated circuit comprising:
a system bus divided into stages and configured to transfer signals;
stage elements configured to connect the stages in series and operate in a divided mode transferring signals from a stage on an input side to a stage on an output side in synchronization with a clock signal and in a through mode that always passes signals from the stage on the input side to the state on the output side; and
a plurality of function modules connected to the different stages,
wherein the plurality of function modules operate in synchronization with the clock signal.

4. The semiconductor integrated circuit of claim 3, further comprising a clock transfer circuit configured to supply the clock signal to the stage elements in the divided mode and stop the supply of the clock signal to the stage elements in the through mode.

5. The semiconductor integrated circuit of claim 3, wherein the function modules have equivalent functions.

6. The semiconductor integrated circuit of claim 5, wherein the function modules each comprise a memory having a function of storing data.

7. The semiconductor integrated circuit of claim 3, wherein each of the stage elements comprises a storage circuit configured to hold a signal transferred from the stage on the input side.

8. The semiconductor integrated circuit of claim 7, wherein the storage circuit comprises a flip-flop circuit configured to latch and hold the signal in synchronization with the clock signal.

9. The semiconductor integrated circuit of claim 8, wherein the stage element comprises a clock controller configured to supply clock signals to the flip-flop circuit in the divided mode, and in the through mode, stop the supply of the clock signals to the flip-flop circuit and keep the storage circuit passing the signal therethrough.

10. A semiconductor integrated circuit comprising:
   a system bus divided into stages and configured to transfer signals;
   stage elements configured to connect the stages in series and operate in a divided mode transferring signals from a stage on an input side to a stage on an output side in synchronization with a clock signal and in a through mode that always passes signals from the stage on the input side to the stage on the output side; and
   a plurality of function modules connected to the different stages,
   wherein each of the stage elements comprises:
   a storage circuit configured to hold a signal transferred from the stage on the input side, comprising a flip-flop circuit configured to latch and hold the signal in synchronization with the clock signal; and
   a clock controller configured to supply clock signals to the flip-flop circuit in the divided mode, and in the through mode, stop the supply of the clock signals to the flip-flop circuit and keep the storage circuit passing the signal therethrough,
   wherein the supply of the clock signals to the function modules stops in the through mode.

* * * * *